United States Patent [19]

Morgan et al.

[11] Patent Number: 5,148,353
[45] Date of Patent: Sep. 15, 1992

[54] MOUNTING SYSTEM FOR INSTALLATION OF COMMUNICATION BOXES HAVING A CONVEX BOTTOM POST AND A RIGID TOP POST

[75] Inventors: Stuart K. Morgan, Westford; Lawrence Bibeau, Worcester; Michael Romm, Brighton; Gary V. Vacon, Melrose; John A. Visser, Wakefield, all of Mass.

[73] Assignee: Digital Equipment Corporation, Hudson, Mass.

[21] Appl. No.: 807,961

[22] Filed: Dec. 10, 1991

Related U.S. Application Data

[63] Continuation of Ser. No. 546,552, Jun. 29, 1990, abandoned.

[51] Int. Cl.$^5$ .......................... H05K 7/16; H05K 5/02; H01R 4/52
[52] U.S. Cl. .................... 361/391; 439/341; 439/928; 211/41; 361/394
[58] Field of Search .............. 361/353, 355, 390, 391, 361/392, 393, 394, 395; 439/341, 347, 928; 211/41; 248/27.3, 221.3, 221.4, 222.1

[56] References Cited

U.S. PATENT DOCUMENTS

| | | | |
|---|---|---|---|
| 4,227,762 | 10/1980 | Scheiner | 439/347 |
| 4,279,397 | 7/1981 | Larsson | 248/221.3 |
| 4,738,632 | 4/1988 | Schmidt et al. | 439/928 X |
| 4,923,408 | 5/1990 | Zinn | 439/341 |
| 4,972,296 | 11/1990 | Chu | 439/341 X |

FOREIGN PATENT DOCUMENTS

0119951  9/1984  Fed. Rep. of Germany ...... 439/341

Primary Examiner—Leo P. Picard
Assistant Examiner—Michael W. Phillips
Attorney, Agent, or Firm—Arnold, White & Durkee

[57] ABSTRACT

A mounting system for the installation of communication termination blocks and communication boxes ("system blocks") on a backplane substantially reduces space requirements for a communications center. The system includes a system block that quickly and removably mounts to a slot in a track. A locking slide either automatically or manually engages the block to hold it securely in place, both mechanically and electrically. Lifting the locking slide releases the block. The block includes an elongated hook that provides lateral support for the block during installation and removal to ensure proper mating of electrical conductors.

11 Claims, 5 Drawing Sheets

MOUNTING SYSTEM FOR INSTALLATION OF COMMUNICATION BOXES HAVING A CONVEX BOTTOM POST AND A RIGID TOP POST

RELATED APPLICATIONS

This application is a continuation of U.S. patent application Ser. No. 07/546,552, filed Jun. 29, 1990, now abandoned.

This invention is related to the following applications, all of which are assigned to the assignee of the present invention:

Wiring Strategy For Twisted-Pair Building Wiring, U.S. Pat. Ser. No. 07/759,931, filed Sep. 16, 1991.

A High Performance, Low Cost Terminal Server Architecture, U.S. Pat. Ser. No. 07/548,104, filed Jun. 29, 1990.

BACKGROUND OF THE INVENTION

Known communication centers include racks or cabinets with a number of active components. These communication centers, for example, connect a number of personal computers into a local area network. The personal computers connect in various ways to a communication system "backbone," which, as the name implies, provides the major communication link within the network. The rack-type installation or "wiring closet" is usually located within a closet or some other out-of-the-way space such as a utility room.

Wiring closets are expensive and require a substantial amount of space. Further, their installation requires skilled labor, and this alone raises their cost.

It would therefore be advantageous to provide a communication center that requires a minimum of space and need not be located within its own dedicated closet. Such a system should require a minimum of time and skill in its installation.

Wiring cabinets are less expensive than wiring closets and can be installed in hallways. These cabinet-type installations are less labor intensive to install and maintain than wiring closets, but the large size of existing communications boxes and the complexity of wiring makes cabinet-type installations only an interim solution in the trend to install small, distributed-wiring centers.

It would therefore also be advantageous to provide a communication center that reduces the size of communications boxes and simplifies the wiring of the center.

In some known communications systems, a single conductor from each workstation or personal computer connects to its own plug at the rack o cabinet. This plug communicates directly with the backbone to communicate with the other elements in the system. This wiring scheme is expensive and is rather labor intensive, requiring a manual plugging operation for each workstation or personal computer in the network.

It would therefore also be advantageous to provide a communication center that simultaneously furnishes a number of connections for system stations. As used herein, the term "station" refers to a personal computer, workstation, or other device that is connected to a network.

SUMMARY OF THE INVENTION

The present invention provides a modular system for mounting communications boxes that can be installed in an office. It can be mounted on the wall or may be mounted on partitions, thus minimizing space requirements. This modular system, installed for example in a system manager's office, reduces maintenance cost and increases network reliability. As used herein, the terms "communications box" and "communication block," refer to communications system active components such as terminal servers, repeaters, and bridges. A bridge provides the communications link between a repeater and the backbone. Also as used herein, the term "termination block" refers to communications system passive components. The present invention is equally applicable to communication blocks and termination blocks. As used herein, the term "system block" means both communication and termination blocks.

This modular system includes a wall-mountable track having a plurality of track slots, each of which can hold a system block. Each system block accommodates a desired number of stations, for example eight. The system block preferably includes a bottom elongated "hook" that faces downward and engages a mating aperture in the track slot. The bottom hook provides vertical support for the system block when it is installed and helps ensure proper mechanical and electrical connection between the system block and the track.

The system block also includes a post near the top of the block that engages a locking slide on the track slot. To install a system block, the installer simply inserts the bottom hook into its mating aperture in the track slot, swivels the block forward until the top post slides a locking slide up, and presses the block forward until the locking slide engages the top post. In doing so, pins of a male connector in the block automatically and properly engage female receptacles in the track slot. This connection can accommodate a number of stations, thus eliminating a number of cumbersome, expensive, and time-consuming wiring connections.

Those of skill in the art will recognize these and other advantages of the present invention while reading the following detailed description in conjunction with the accompanying drawings.

DETAILED DESCRIPTION OF A PREFERRED EMBODIMENT

Figure 1:
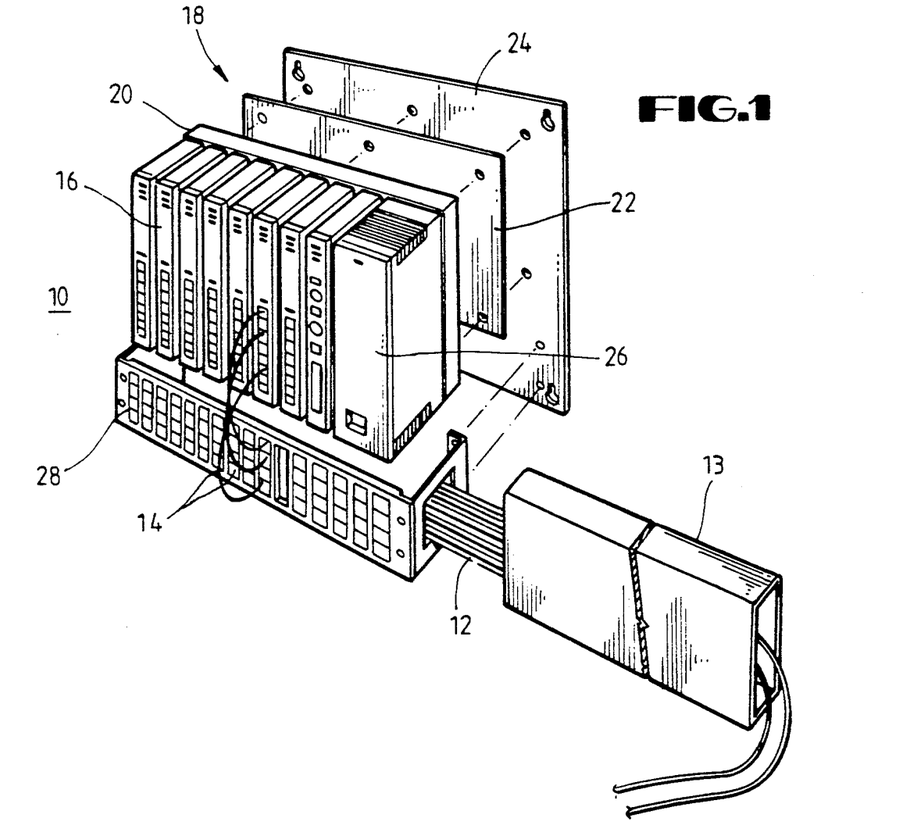
FIG. 1 is perspective, partially exploded view of a modular communications center of the present invention.
Figure 2A:
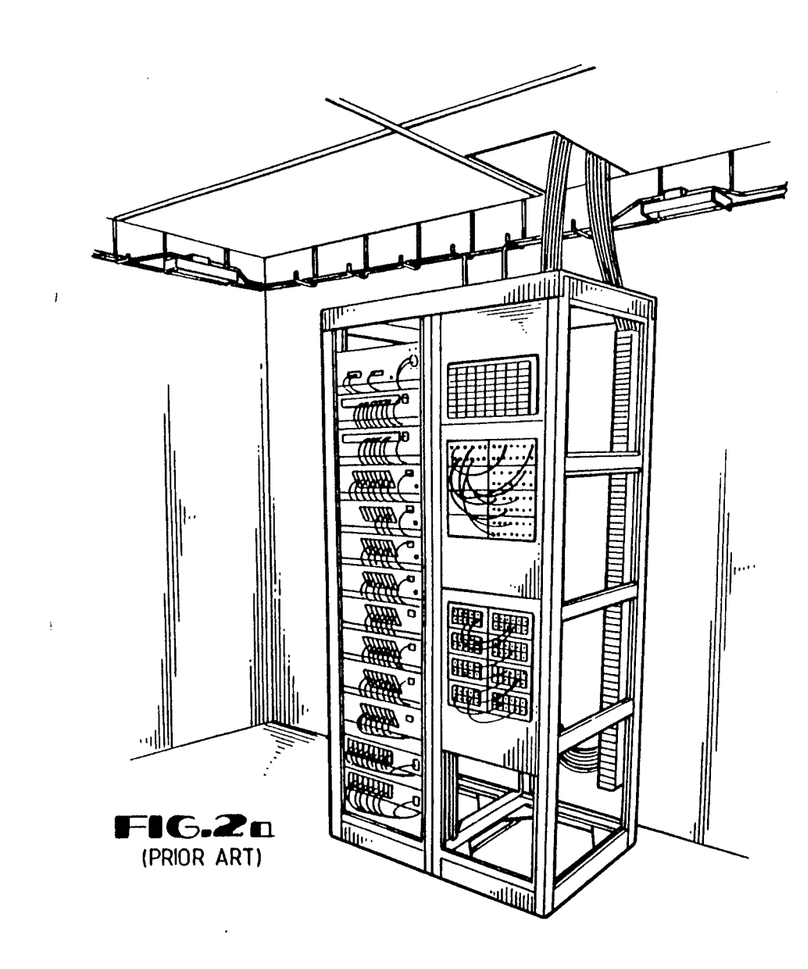
FIG. 2a is a perspective view of a prior art rack-type communications center.
Figure 2B:
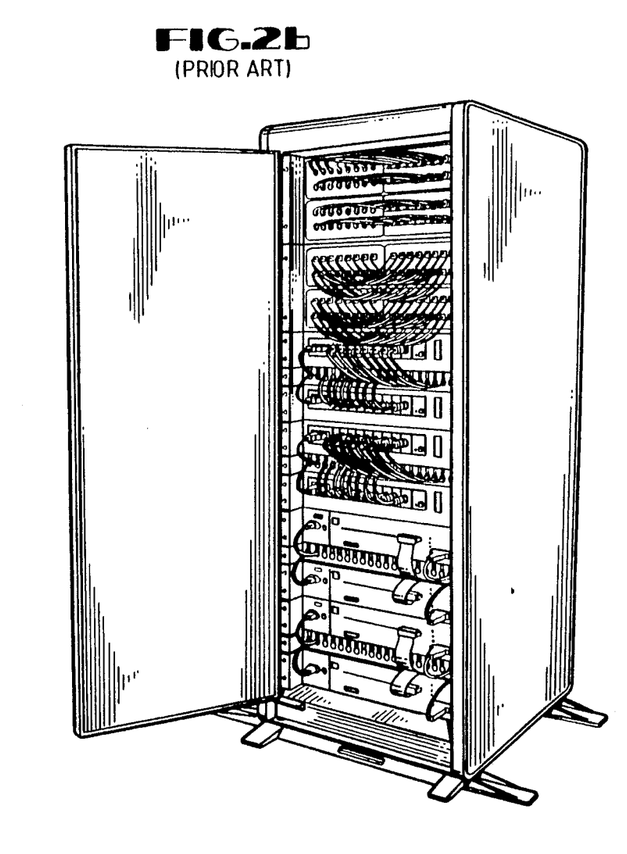
FIG. 2b is a perspective view of a prior art cabinet-type communications center.

A modular communications center 10 constructed and arranged according to a preferred embodiment of the present invention is shown in FIG. 1. The communications center 10 replaces prior art communications centers, such as the rack-type installation depicted in FIG. 2a, or the cabinet-type communications center depicted in FIG. 2b. Contrary to the prior art communication centers, the communication center according to the present invention is not space consuming, is not complex, and is relatively inexpensive.

The communication center 10 makes selective electrical interconnections between incoming wires 12 from a plurality of stations and patch-panel wires 14. The communication center 10 receives incoming wires 12 by way of a cable-way or conduit 13. Conduit 13 may also be referred to as a "race-way." Specific interconnections are made within a number of system blocks 16 which are plugged into a main support assembly 18. The main support assembly 18 provides mechanical support and the communications link for a plurality of system blocks 16.

As depicted in FIG. 1, the communications center 10 includes a number of system blocks 16 installed on a track 20. Each system block 16 fits in one of a plurality of track slots arranged side-by-side in the track. The track 20 is mounted on a back mounting plate 22 which in turn is mounted on a wall mounting plate 24. This configuration permits easy installation of the communications center directly on a wall or partition. The communications center of FIG. 1 also includes a power supply 26 and a patch panel 28.

Figure 3:
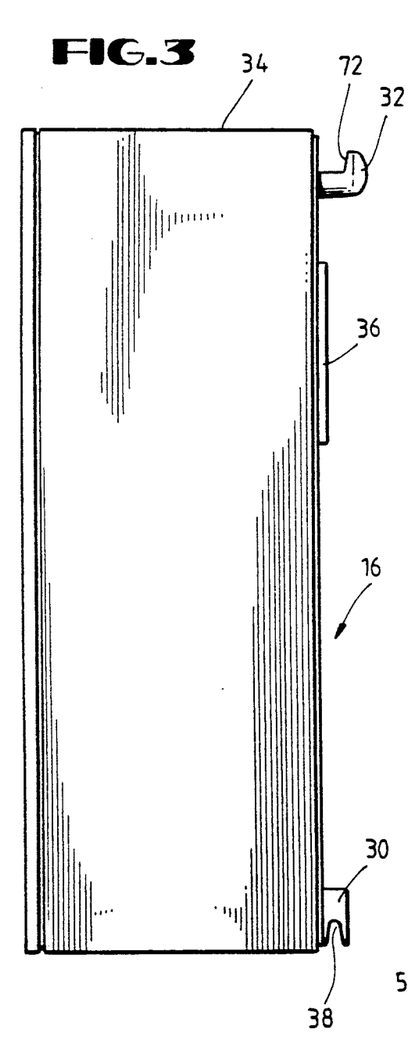
FIG. 3 is a right-handed side view of a system block according to a preferred embodiment of the present invention.

FIG. 3 depicts a system block 16. The block 16 includes a bottom elongated downwardly facing hook 30, a top post 32, a casing 34, and a male portion 36 of a connector. The hook 30 has a pivot surface 38 on its lower end. This pivot surface 38 ensures smooth and secure mating of the connector as explained more fully below.

The hook 30 serves as part of a first interengaging means proximate one end of each terminal block. The top post serves as part of a second interengaging means proximate the opposite end of each terminal block. Each track slot includes the remainder of the first and second interengaging means.

Figure 10:
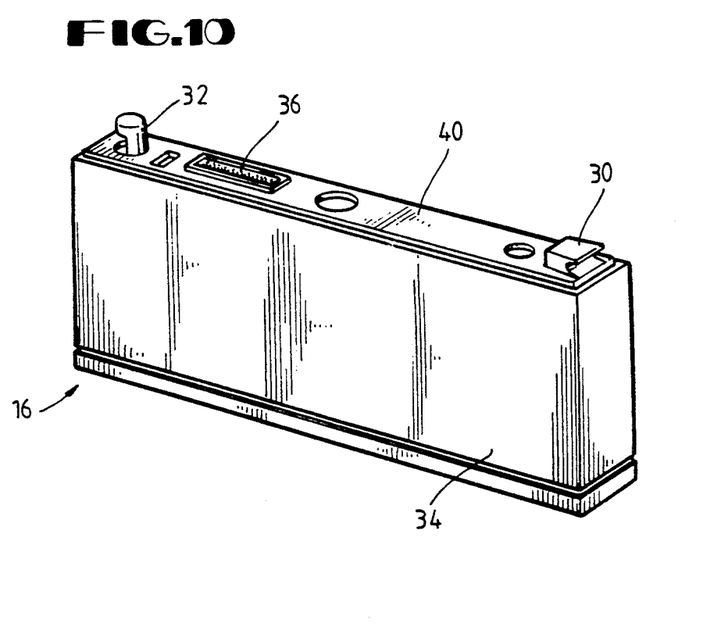
FIG. 10 is a perspective view of a system block.

FIG. 10 presents a perspective view of such a system block 16, including the hook 30, the top post 32, the casing 34 and the male portion 36 of a connector. The hook 30 and the post 32 are mounted on a face 40 of the casing 34, or they may be formed as an integral part of the casing.

Figures 4, 5:
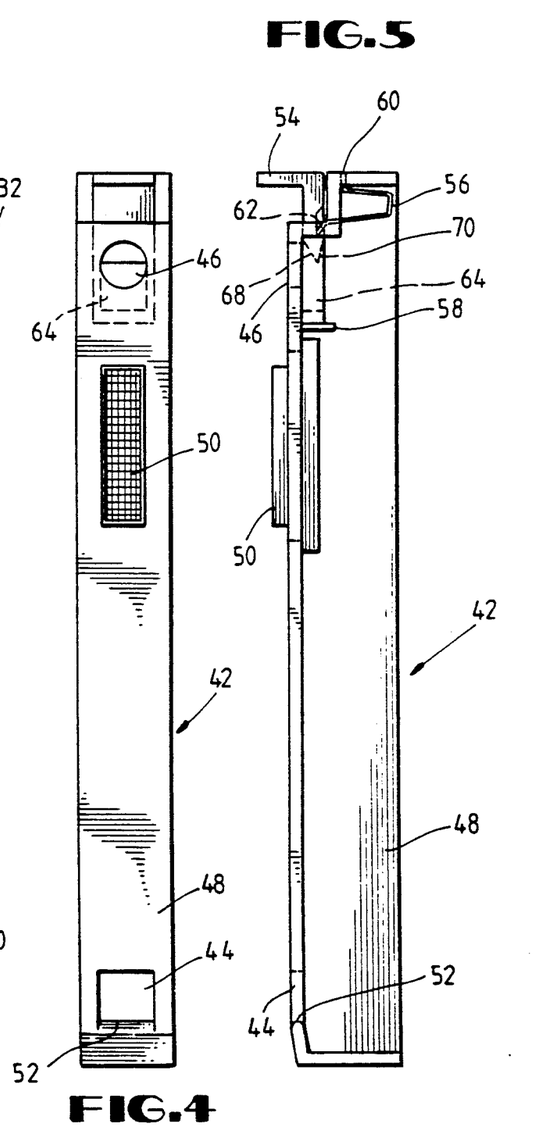
FIG. 4 is a front view of a track slot, the aspect presented to a system block.
FIG. 5 is a s view of a track slot.

FIGS. 4 and 5 depict the track slot 42. The track slot 42 forms a portion of the track 20, shown in FIG. 1. The track slot includes a lower mating aperture 44, an upper mating aperture 46, a support frame 48, and a female portion 50 of the connector. When a system block 16 is installed in a track slot 42, the hook 30 extends though the lower mating aperture 44 and is supported by a lower edge 52 of the lower mating aperture 44. The lower edge 52 is preferably rounded to match the radius of curvature of the pivot surface 38 of the block 16.

The lower mating aperture 44 serves as the remainder of the first interengaging means as described above with regard to FIG. 3.

The track slot 42 also includes a locking slide 54. The locking slide 54 serves as the remainder of the second interengaging means. A biasing spring 56 biases the locking slide 54 against a retaining barrier 58. The biasing spring 56 is retained in place by a channel 60 at one end of the biasing spring 56 and by a notch 62 in the locking slide 54 at the other end of the biasing spring 56.

The locking slide 54 has an aperture 64. The upper edge of the aperture 64 forms a knife edge 66 with a slanted side 68. When the block 16 is inserted into the track slot 42, the post 32 contacts the slanted side of the knife edge 66 creating upward force on the locking slide 54. As the block 16 is further inserted into the slot 42, the knife edge 66 eventually reaches the upper extremity of the post 32 and the block snaps into place. In this position, a second side 70 of the knife edge 66 abuts a retaining surface 72 (FIG. 3) of the post 32 to hold the block securely in place, both electrically and mechanically. In FIG. 3, the retaining surface 72 is parallel to the surface of the block 16, but needs only be substantially parallel to the surface.

Figure 6:
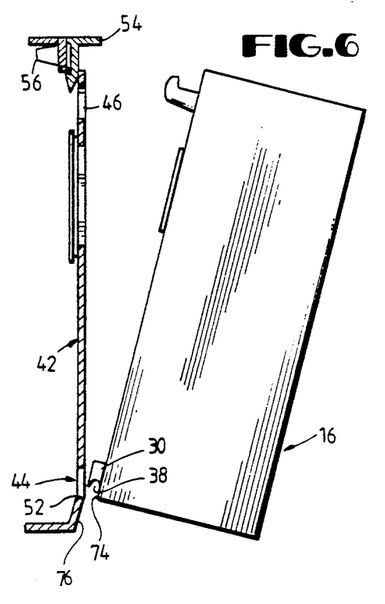
FIGS. 6 through 9 are cross-sectional side views of a system block and a track slot to illustrate the method of installing a system block.

FIGS. 6 through 9 show this sequence of operation. In FIG. 6, the block 16 is placed adjacent the track slot 42. In FIG. 6, the hook 30 on the block 16 is not flush with the bottom of the block. Rather, block 16 includes a small surface 74. Consequently, the lower extremity of the track slot 42 is canted back slightly below the lower mating aperture on a surface 76 to avoid interfering with the small surface 74. Also, the edge 52 is rounded with the same radius of curvature as the pivot surface 38 so that the block 16 smoothly pivots into place.

Figure 7:
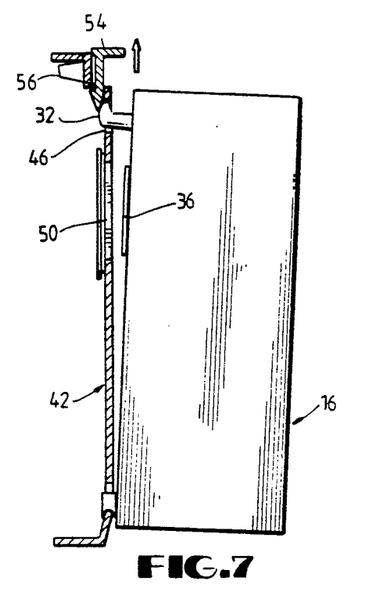

In FIG. 7, the block has pivoted forward and the post 32 has entered the upper mating aperture 46. The post 32 has contacted the slanted side 68 of the knife edge 66. The arrow in FIG. 7 indicates the upward force exerted on the locking slide 54. The pivoting action, that is, the interaction of the pivot surface 38 and the lower edge 52 of the lower mating aperture 44 ensures proper mechanical and electrical connection between the male portion 36 of the connector and the female portion 50 of the connector.

Figure 8:
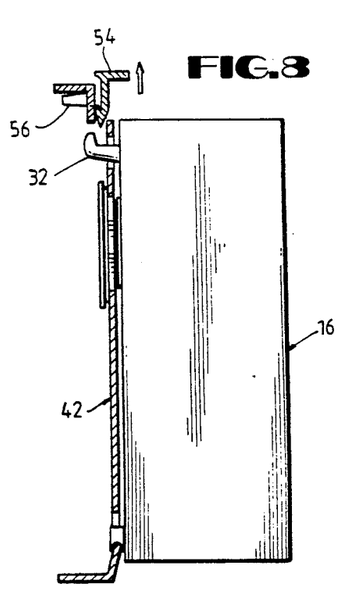
Figure 9:
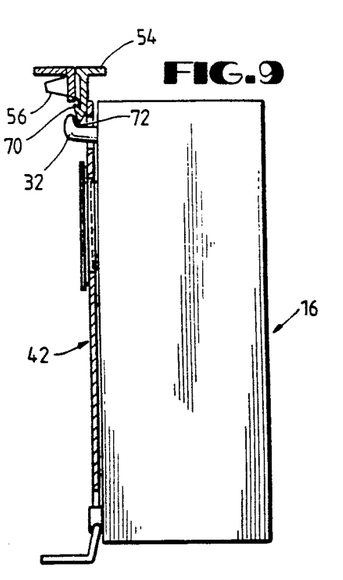

FIG. 8 depicts the block 16 fully inserted into the track slot 42. FIG. 8 also illustrates that, alternatively, the locking slide 54 can be manually lifted if desired. Lifting the locking slide 54 exerts torsion stress on the biasing spring 56 creating a downward force on the locking slide. When the locking slide 54 is released as in FIG. 9, the biasing spring forces the locking slide down until the slanted side 70 of the knife edge 66 abuts the retaining surface 72 of the post 32. In FIG. 9, the retaining surface 72 is not precisely parallel to the surface of the block, but only substantially so.

To remove a block 16, an operator simply reverses the steps just described. That is, he lifts the locking slide 54 until it is free of the post 32, pivots the block back away from the track slot 42, and lifts the block clear of the track.

Figure 11:
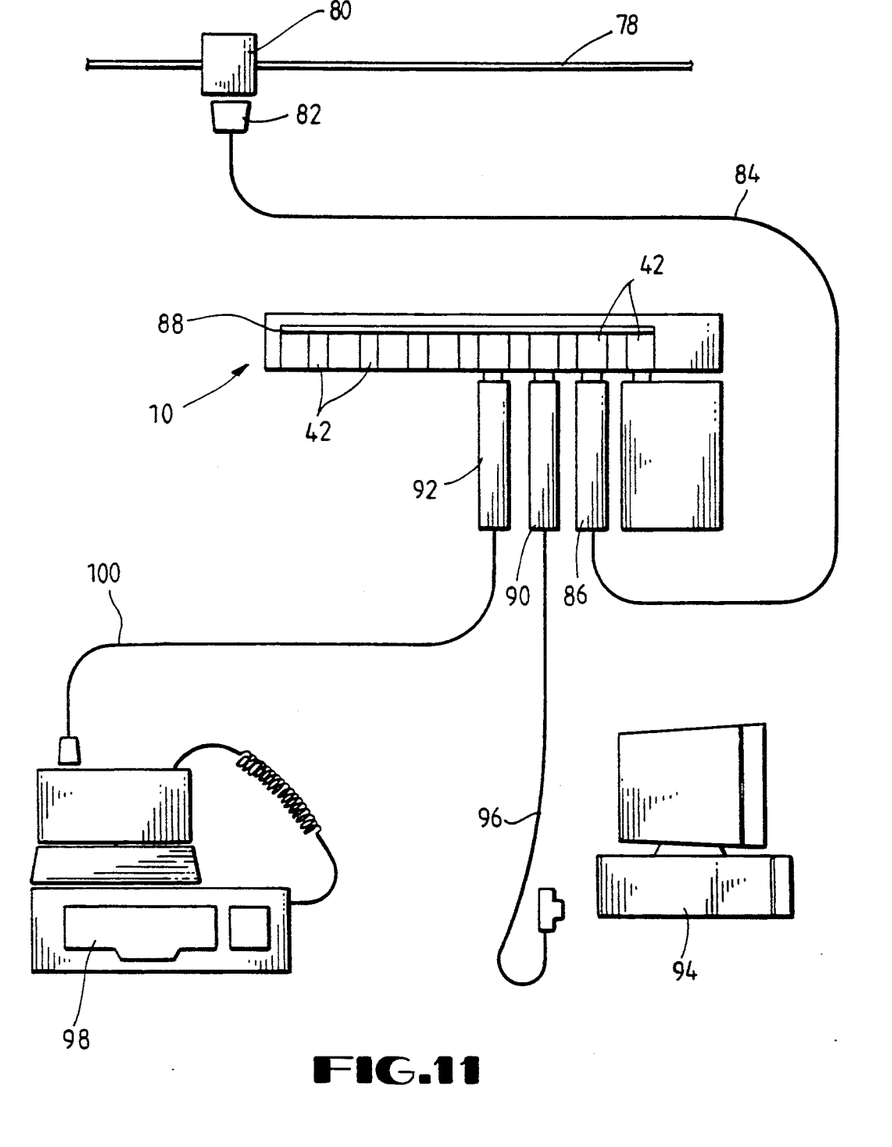
FIG. 11 is a top view of a communications center of the present invention including various interconnections from the center to equipment that it serves.

FIG. 11 depicts a top view of a communications center 10 and connections to various equipment served by the center. The communications center communicates with a computer network backbone 78 by way of a backbone tap 80 and plug 82. The backbone tap 80 communicates with the communications center 10 via a transceiver cable 84. The transceiver cable 84 connects directly to a bridge 86. The bridge 86 plugs directly into a track slot 42 as described herein. In this way, the bridge communicates directly with the local area network (LAN) backbone 88. Thus, the bridge 86 provides the link to a repeater 90 and a terminal server 92. The communications center provides a number of track slots 42 to accommodate more repeaters and servers, not shown. In fact, the system is easily expanded to include two or more such communications centers side by side, simply by including a connection between the LAN backbones 88 in each.

The repeater 90 provides communication to a personal computer or workstation 94 by way of a cable 96.

Each repeater 90 preferably serves a plurality of computers or workstations 94.

The terminal server 92 in turn serves a terminal 98 by way of a twisted pair cable 100. Each terminal server 92 preferably serves a plurality of terminals 98.

Although various embodiments of the present invention have been described with a certain degree of particularity, it is to be understood that the present disclosure has been made only by way of example. Modifications and changes in details of construction may be made without departing from the spirit and scope of the invention. For example, the system block and its associated parts may be reversed; that is, the hook may be on the top of the face of the casing and the post on the bottom. Then, the locking slide moves down to accept a post and the biasing spring or equivalent means tends to force the locking slide upward. Also, the male and female portions of the connector may be reversed. These and other modifications will be apparent to those of skill in the art.

We claim:

1. A modular, wall-mountable system for mounting system blocks in a computer network, said system comprising:
   a. a system block comprising
      i. a casing having a face,
      ii. a bottom hook being rigidly coupled to the casing and extending outwardly from the casing fae in a given direction, the hook having a downwardly-facing concave pivot surface,
      iii. a top post being rigidly coupled to the casing and extending outwardly from the casing face in said given direction, the top post having a retaining surface substantially parallel to the casing face, and
      iv. a connector located on the casing face, and
   b. a wall-mountable track having a plurality of track slots to accommodate a plurality of system blocks, each track slot comprising
      i. a support frame having defined therein a lower mating aperture configured to receive the hook and bounded on a side by a convex upwardly-facing edge of the support frame, the edge being curved to substantially match the pivot surface of the hook,
      ii. an upper mating aperture in the support frame configured to receive the post,
      iii. a locking slide slidably mounted on the support frame, the locking slide having a first position and a second position, with the locking slide in the first position permitting the insertion of the post into and removal from the upper mating aperture and with the locking slide in the second position preventing the removal of the post from the upper mating aperture by engaging the top post retaining surface,
      iv. a biasing spring disposed between the support frame and locking slide, the biasing spring serving to bias the locking slide to the second position and,
      v. a complementary connector located on the support frame and being adapted to couple to the connector on the casing face.

2. The system of claim 1 wherein the system block is further adapted to receive a plurality of inputs.

3. The system of claim 1 wherein the system block is a terminal server.

4. The system of claim 1 wherein the system block is a repeater.

5. The system of claim 1 wherein the system block is a bridge.

6. A system block for making communications connections to a track slot in a computer network, said system block comprising:
   a. a casing having a face,
   b. a bottom hook being rigidly coupled to the casing and extending outwardly from the casing face in a given direction, the hook having a downwardly-facing concave pivot surface being adapted to engage an upwardly-facing convex edge defining one side of a first aperture in the track slot,
   c. a top post being rigidly coupled to the casing and extending outwardly from the casing face in said given direction, the top post having a retaining surface substantially parallel to the casing face and being adapted to be received within a second aperture in the track slot and to engage a locking slide included in the track slot, and
   d. a connector being located on the casing face and being adapted to electrically mate with a corresponding the connector located in the track slot.

7. The system block of claim 6 wherein the system block is a terminal server.

8. The system block of claim 6 wherein the system block is a repeater.

9. The system block of claim 6 wherein the system block is a bridge.

10. A wall-mountable track slot for making connections in a computer network and adapted to detachably couple to a system block having first and second coupling members, comprising
    a. a support frame having defined therein a lower mating aperture configured to receive the first coupling member of the system block and being bounded on a side by a convex upwardly facing edge, the support frame also having defined therein an upper mating aperture configured to receive the second coupling member of the system block,
    b. a locking slide slidably mounted on the support frame, the locking slide having a first position and a second position, with the locking slide in the first position permitting the insertion of the second coupling member into and removal from the upper mating aperture and with the locking slide in the second position preventing the removal of the second coupling member from the upper mating aperture by engaging the second coupling member,
    c. a biasing spring disposed between the support frame and locking slide, the biasing spring serving to bias the locking slide to the second position and
    d. a connector being located on said support frame and being adapted to electrically mate with a corresponding connector located on the system block.

11. A system for mounting a system block in a computer network, said system comprising:
    a system block being defined by a substantially closed box being generally rectangular in shape and having a mounting surface;
    a first coupling member being rigidly coupled to said system block and extending outwardly from said mounting surface in a given direction, said first coupling member having a downwardly-facing concave pivot surface;
    a second coupling member being rigidly coupled to said system block and extending outwardly from said mounting surface in said given direction, said second coupling member having a retaining surface;

a first connector being located on said mounting surface;

a wall-mounting plate being adapted to mount to a wall;

a back-mounting plate being adapted to detachably couple to said wall-mounting plate when said wall-mounting plate is mounted to a wall;

a track being coupled to said back-mounting plate, said track having a track slot, said track slot having located thereon a first mating member configured to complementary receive said first coupling member, said first mating member having a convex upwardly-facing portion being curved to substantially match said pivot surface of said first coupling member, said track slot having located thereon a second mating member configured to receive said second coupling member, said second mating member having a locking member being slidably mounted on said track slot, said locking member being slidable moveable between a first position and a second position and being resiliently biased in said second position, such that said locking ember facilitates decoupling between said second coupling member and said second mating member in said first position and hinders decoupling between said second coupling member and said second mating member in said second position, and a second connector located in said slot.

* * * * *

UNITED STATES PATENT AND TRADEMARK OFFICE
CERTIFICATE OF CORRECTION

PATENT NO. : 5,148,353

DATED : September 15, 1992

INVENTOR(S) : Morgan, et. al.

It is certified that error appears in the above-identified patent and that said Letters Patent is hereby corrected as shown below:

Column 1, line 50, "o" should be --or--.

Column 2, line 54, "s" should be --side--.

Signed and Sealed this

Thirtieth Day of November, 1993

Attest:

BRUCE LEHMAN

*Attesting Officer*   *Commissioner of Patents and Trademarks*